United States Patent
Lell et al.

(10) Patent No.: US 11,923,662 B2
(45) Date of Patent: Mar. 5, 2024

(54) EDGE-EMITTING LASER BAR

(71) Applicant: OSRAM OLED GmbH, Regensburg (DE)

(72) Inventors: Alfred Lell, Maxhuette-Haidhof (DE); Muhammad Ali, Regensburg (DE); Bernhard Stojetz, Wiesent (DE); Harald Koenig, Bernhardswald (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 17/807,272

(22) Filed: Jun. 16, 2022

(65) Prior Publication Data

US 2022/0311219 A1 Sep. 29, 2022

Related U.S. Application Data

(63) Continuation of application No. 16/637,698, filed as application No. PCT/EP2018/072561 on Aug. 21, 2018, now Pat. No. 11,411,375.

(30) Foreign Application Priority Data

Aug. 28, 2017 (DE) .......................... 102017119664.1

(51) Int. Cl.
*H01S 5/40* (2006.01)
*H01S 5/0234* (2021.01)
(Continued)

(52) U.S. Cl.
CPC .......... *H01S 5/4031* (2013.01); *H01S 5/0234* (2021.01); *H01S 5/02461* (2013.01);
(Continued)

(58) Field of Classification Search
CPC ............... H01S 3/0234; H01S 3/02461; H01S 3/32341; H01S 3/4031
See application file for complete search history.

(56) References Cited

U.S. PATENT DOCUMENTS 5,619,521 A 4/1997 Tanaka
6,353,625 B1 3/2002 Yoneda
(Continued)

FOREIGN PATENT DOCUMENTS

CN 101188345 A 5/2008
CN 101814700 A 8/2010
(Continued)

OTHER PUBLICATIONS

K. Samonji, et al., "6.3W InGaN Laser Diode Array with Highly Efficient Wide-Striped Emitters," 2011 IEEE Photonics Conference, pp. 507 & 508, Oct. 9-13, 2011.
(Continued)

*Primary Examiner* — Michael Carter
(74) *Attorney, Agent, or Firm* — Slater Matsil, LLP

(57) ABSTRACT

An edge emitting laser bar is disclosed. In an embodiment an edge-emitting laser bar includes an AlInGaN-based semiconductor layer sequence having a contact side and an active layer configured to generate laser radiation, a plurality of individual emitters arranged next to each other and spaced apart from one another in a lateral transverse direction, each emitter configured to emit laser radiation and a plurality of contact elements arranged next to each other and spaced apart from one another in the lateral transverse direction on the contact side for making electrical contact with the individual emitters, each contact element being assigned to an individual emitter, wherein each contact element is electrically conductively coupled to the semiconductor layer sequence via a contiguous contact region of the contact side so that a current flow between the semiconductor layer sequence and the contact element is possible via the contact region.

12 Claims, 10 Drawing Sheets

(51) Int. Cl.
*H01S 5/024* (2006.01)
*H01S 5/042* (2006.01)
*H01S 5/22* (2006.01)
*H01S 5/323* (2006.01)

(52) U.S. Cl.
CPC ........ *H01S 5/02469* (2013.01); *H01S 5/0421* (2013.01); *H01S 5/32341* (2013.01); *H01S 5/04254* (2019.08); *H01S 5/22* (2013.01)

(56) References Cited

U.S. PATENT DOCUMENTS

| | | | |
|---|---|---|---|
| 6,816,528 | B1 | 11/2004 | Kneissl et al. |
| 7,149,235 | B2 * | 12/2006 | Tojo ............ H01S 5/0234 |
| | | | 372/50.122 |
| 8,654,810 | B2 | 2/2014 | Fukasawa et al. |
| 8,976,829 | B2 | 3/2015 | Koenig et al. |
| 9,065,235 | B2 | 6/2015 | Pruijmboom et al. |
| 9,231,374 | B2 | 1/2016 | Inoue et al. |
| 9,780,078 | B2 | 10/2017 | Hoeppel |
| 10,554,019 | B2 | 2/2020 | Singer et al. |
| 11,411,375 | B2 * | 8/2022 | Lell ............ H01S 5/32341 |
| 2008/0291960 | A1 * | 11/2008 | Inoue ............ H01S 5/02375 |
| | | | 372/45.01 |
| 2011/0200064 | A1 | 8/2011 | Banno |
| 2012/0287958 | A1 * | 11/2012 | Lell ............ H01S 5/4043 |
| | | | 372/45.01 |
| 2013/0308667 | A1 | 11/2013 | Hagino et al. |
| 2014/0086539 | A1 | 3/2014 | Goutain et al. |
| 2015/0016481 | A1 * | 1/2015 | Berger ............ H01S 5/02407 |
| | | | 372/36 |
| 2015/0055670 | A1 * | 2/2015 | Inoue ............ H01S 5/04254 |
| | | | 372/45.01 |
| 2017/0054271 | A1 | 2/2017 | Muller et al. |

FOREIGN PATENT DOCUMENTS

| | | |
|---|---|---|
| CN | 102709808 A | 10/2012 |
| CN | 102893466 A | 1/2013 |
| CN | 103326244 A | 9/2013 |
| CN | 103843211 A | 6/2014 |
| CN | 105637636 A | 6/2016 |
| DE | 102009054564 A1 | 6/2011 |
| DE | 102015116970 A1 | 4/2017 |
| EP | 1396914 A1 | 3/2004 |
| JP | H11233877 A | 8/1999 |
| JP | 2003069152 A | 3/2003 |
| JP | 2011166068 | 8/2011 |
| JP | 2015026640 A | 2/2015 |
| JP | 2015041730 A | 3/2015 |
| JP | 2015135911 A | 7/2015 |
| WO | 9915934 A1 | 4/1999 |
| WO | 2012101686 A1 | 8/2012 |

OTHER PUBLICATIONS

M. Werner, et al., "100 W / 100 µm passivelycooled, fiber coupled diode laser at 976 nm based on multiple 100 µm single emitters," Proceedings of SPIE—The International Society for Optical Engineering, Proc. of SPIE vol. 7198 71980P-1-7, Feb. 23, 2009.

* cited by examiner

EDGE-EMITTING LASER BAR

This is a continuation application of U.S. application Ser. No. 16/637,698, entitled "Edge-Emitting Laser Bar," which was filed on Feb. 7, 2020, which is a national phase filing under section 371 of PCT/EP20 2018/072561, filed Aug. 21, 2018, which claims the priority of German patent application 102017119664.1, filed Aug. 28, 2017, all of which is incorporated herein by reference in its entirety.

TECHNICAL FIELD

An edge-emitting laser bar is specified.

BACKGROUND

One task to be solved is to specify an edge-emitting laser bar for the emission of blue laser radiation with a low failure rate.

SUMMARY

According to at least one embodiment, the laser bar comprises an AlInGaN-based semiconductor layer sequence with a contact side and an active layer for generating the laser radiation. The semiconductor material of the semiconductor layer sequence is for example, $Al_nIn_{1-n-m}Ga_mN$ where $0 \leq n \leq 1$, $0 \leq m \leq 1$ and $m+n \leq 1$. The semiconductor layer sequence may contain dopants as well as additional components. For the sake of simplicity, however, only the essential components of the crystal lattice of the semiconductor layer sequence, i.e., Al, Ga, In and N, are given, even if these may be partially replaced and/or supplemented by small quantities of other substances.

The active layer of the semiconductor layer sequence can, for example, generate electromagnetic radiation in the yellow, green, blue or UV range during intended operation.

The contact side of the semiconductor layer sequence of the laser bar forms a top surface or outer surface of the semiconductor layer sequence and consists of the material of the semiconductor layer sequence. The contact side preferably runs essentially parallel to the active layer.

A laser bar is understood here and in the following as an element that can be handled separately and contacted electrically. A laser bar is created in particular by separation from a wafer composite. A laser bar preferably comprises exactly one originally contiguous area of the semiconductor layer sequence grown in the wafer composite. The semiconductor layer sequence of the laser bar is preferably formed contiguously. The active layer of the laser bar can be contiguous or segmented. The lateral expansion of the laser bar, measured parallel to the main extension plane of the active layer, is, for example, at most 1% or at most 5% greater than the lateral expansion of the active layer.

The semiconductor layer sequence of the laser bar is, for example, grown or epitaxially deposited on a GaN growth substrate. The laser bar also preferentially comprises the growth substrate. The growth substrate is arranged in particular on the side of the semiconductor layer sequence opposite the contact side. In the mounted configuration, the contact side may form a counter contact side or an underside of the semiconductor layer sequence.

The active layer may, for example, have a conventional pn junction, a double heterostructure, a single quantum well structure (SQW structure) or a multiple quantum well structure (MQW structure) for light generation. In addition to the active layer, the semiconductor layer sequence can include further functional layers and functional areas, such as p- or n-doped charge carrier transport layers, i.e., electron or hole transport layers, undoped or p- or n-doped confinement, cladding or waveguide layers, barrier layers, planarization layers, buffer layers, protective layers and/or electrodes as well as combinations thereof. In addition, additional layers, such as buffer layers, barrier layers and/or protective layers, can also be arranged perpendicular to the growth direction of the semiconductor layer sequence, for example around the semiconductor layer sequence, i.e., on the side surfaces of the semiconductor layer sequence.

Between the active layer and the growth substrate, the semiconductor layer sequence preferably comprises one or more n-doped layers. Between the active layer and the contact side, the semiconductor layer sequence preferably comprises one or more p-doped layers. Alternatively, one or more n-doped layers may be arranged between the active layer and the contact side.

According to at least one embodiment, the edge-emitting laser bar comprises several individual emitters arranged next to each other in a lateral transverse direction and spaced apart from one another, each emitting laser radiation during intended operation. The individual emitters of the laser bar may be operated individually and independently of each other. The individual emitters of a laser bar are often referred to as laser diodes. The individual emitters are spaced apart regions of the laser bar in which laser radiation is generated. Each individual emitter comprises a subregion of the semiconductor layer sequence. The width of an individual emitter, measured parallel to the lateral transverse direction, is defined, for example, by the region of the active layer in which laser radiation is generated during normal operation of the individual emitter. In the intended operation of the laser bar, for example, the individual emitters are controlled simultaneously and in parallel. Preferably, the individual emitters then all generate laser radiation simultaneously, which is coupled out of the laser bar along a lateral longitudinal direction. For this purpose, the laser bar preferably comprises two facets opposite each other in the lateral longitudinal direction, which form the mirrors of a resonator.

The lateral transverse direction is a direction parallel to the main extension plane of the active layer. The lateral longitudinal direction is a direction parallel to the main extension plane of the active layer and perpendicular to the lateral transverse direction.

According to at least one embodiment, the laser bar comprises several contact elements arranged next to each other and spaced apart from one another in the lateral transverse direction on the contact side. The contact elements are used for electrical contacting of the individual emitters. The contact elements are preferably not connected to each other but are electrically conductive structures separated from one another on the contact side. The individual emitters can be controlled by energizing the contact elements. A contact element is preferably assigned to each individual emitter for this purpose, in particular it is uniquely assigned. In the unmounted configuration of the laser bar, the contact elements are preferably exposed or are freely accessible.

In particular, the contact elements can each have or be made of a metal, a metal alloy or a metal mixture or a transparent conductive oxide such as indium tin oxide (ITO). For example, the contact elements have several layers of different contact materials. For example, a first layer may contain or consist of one or more materials selected from Pd, Pt, ITO, Ni and Rh. For example, a second layer may contain or consist of one or more materials selected from Pd, Pt, ITO, Ni, Rh, Ti, Pt, Au, Cr, (Ti)WN, Ag, Al, Zn, Sn and alloys thereof. For example, a third layer or bond layer may comprise or be composed of one or more materials selected from Ti, Pt, Au, Cr, (Ti)WN, Ag, Al and ITO, whereby the bond layer may also form the second layer depending on the choice of material. For example, the bond layer can also have a layer stack with several layers of different materials, for example a layer stack with layers of Ti, Pt and Au. Each contact element, for example, has such a first layer and such a second layer and bond layer, which are stacked on top of each other in this order. The first layer of the contact elements can border directly to the contact side.

The contact elements are preferably elongated or rod-shaped or strip-shaped. For example, the length of each contact element, measured along its longitudinal axis, is at least twice or at least 5 times or at least 10 times its width, measured perpendicular to its longitudinal axis. The widths of the contact elements, for example, are in the range between 1 μm and 200 μm inclusive. In particular, the elongated contact elements are arranged parallel to each other on the contact side. This means that the longitudinal axes of the contact elements are essentially parallel to each other. The longitudinal axes of the contact elements are preferably aligned along the lateral longitudinal direction.

In the lateral transverse direction, for example, two contact elements are spaced apart from one another by at least 20 μm or at least 50 μm or at least 100 μm or at least 200 μm. Alternatively or additionally, the distance between two adjacent contact elements is, for example, at most 1 mm or at most 600 μm or at most 400 μm.

According to at least one embodiment, each contact element is electrically conductively coupled to the semiconductor layer sequence via a contiguous contact region of the contact side so that a current flow between the semiconductor layer sequence and the contact element is made possible via the contact region. Each contact region of the contact side is a contiguous, preferably simply-connected, region of the contact side and is thus formed from the semiconductor material of the semiconductor layer sequence. Each individual emitter preferably comprises exactly one contact region. It is also possible, however, that each individual emitter has two contact regions, for example parallel running contact regions, which are separated by, for example, a maximum distance of 30 μm.

For example, each contact element completely covers the assigned contact region. The contact regions can be uniquely assigned to the contact elements. In the contact regions, the contact elements can be in direct mechanical and electrical contact with the semiconductor layer sequence.

The contact regions of the contact side are preferably elongated or strip-shaped. The lengths of the contact regions, measured parallel to the lateral longitudinal direction, for example, are at least twice or at least 5 times or at least 10 times as large as their widths, measured parallel to the lateral transverse direction. The widths of the contact regions, for example, are between 0.5 μm and 200 μm inclusive, preferably 2 μm to 100 μm.

According to at least one embodiment, the laser bar has a thermal decoupling structure in the region between two adjacent individual emitters, which counteracts a heat exchange between the two adjacent individual emitters. "In the region between two adjacent individual emitters" means in particular that the decoupling structure is arranged between two planes running through the adjacent individual emitters and perpendicular to the active layer. The thermal decoupling structure is arranged in particular in the lateral transverse direction between the two adjacent individual emitters. No further individual emitter is arranged between two adjacent individual emitters.

The thermal decoupling structure is preferably configured in such a way that it reduces the thermal conductivity of the laser bar in the region between the two adjacent individual emitters along the lateral transverse direction. Alternatively or additionally, the thermal decoupling structure is designed to dissipate heat in the region between the two adjacent individual emitters.

According to at least one embodiment, the thermal decoupling structure comprises an electrically conductive cooling element applied to the contact side, which completely covers a contiguous, preferably simply-connected, cooling region of the contact side. The cooling region is a region of the contact side and is thus formed from the semiconductor material of the semiconductor layer sequence. The cooling region is formed in particular between the two contact regions of the two adjacent individual emitters.

The cooling element is preferably metallic. For example, the cooling element comprises or consists of one or more of the following materials: Au, Pd, Pt, ITO, Ni, Rh, Ti, Pt, Au, Cr, (Ti)WN, Ag, Al, Zn, Sn, In, W, Ta, Cu, AlN, SiC, DLC. In particular, the cooling element consists of the same material as the contact elements. In the unmounted configuration of the laser bar, the cooling element is preferably exposed, i.e., is freely accessible.

According to at least one embodiment, the cooling element is electrically isolated from the semiconductor layer sequence along the cooling region. In particular, during intended operation, current is neither injected into the semiconductor layer sequence nor decoupled from the semiconductor layer sequence via the cooling region. "Electrically isolated" therefore means in particular that in the cooling region the contact resistance between the cooling element and the semiconductor layer sequence is so high that no or no significant current flows over the cooling region at voltages applied during normal operation. For example, with normally applied voltages, the current flowing over the cooling region is at least a factor of 10 or 100 or 1000 smaller than the current flowing over the contact regions.

Preferably, the cooling element is thermally coupled to the semiconductor layer sequence along the cooling region. For example, the space between the cooling element and the cooling region is filled with a material whose thermal conductivity is at least 1 W/(m·K).

According to at least one embodiment, the cooling region has a width, measured along the lateral transverse direction, which is at least half the width or at least the width or at least 1.5 times the width or at least twice the width or at least 3 times the width or at least 4 times the width of each or at least one adjacent contact region. In particular, the area of the cooling region is at least half the area or at least the area or at least 1.5 times the area or at least twice the area or at least 3 times the area or at least 4 times the area of each or at least one adjacent contact region. The contact regions all have the same width and/or area within the manufacturing tolerance. An adjacent contact region is a contact region closest to the cooling region.

The cooling region may also be elongated, the length being at least twice or at least 5 times or at least 10 times the width. The length of the cooling region may be between 80% and 120% inclusive of the individual lengths of the contact regions.

According to at least one embodiment, the decoupling structure comprises a trench extending at least partially through the laser bar in the vertical direction perpendicular to the active layer, or perpendicular to the lateral transverse direction and perpendicular to the lateral longitudinal direction, respectively. For example, the width of the trench measured parallel to the lateral transverse direction is at least 5 µm or at least 10 µm or at least 50 µm. Alternatively or additionally, the width of the trench is, for example, not more than 300 µm or not more than 200 µm or not more than 150 µm or not more than 100 µm or not more than 50 µm or not more than 10 µm. For example, the length of the trench, measured parallel to the lateral longitudinal direction, is at least twice or at least 5 times or at least 10 times the width of the trench. For example, the depth of the trench is at least 100 nm or at least 500 nm or at least 1 µm or at least 5 µm or at least 10 µm or at least 50 µm or at least 100 µm.

The thermal decoupling structure may also include a cooling element with the associated cooling region and a trench.

So far, only description of one thermal decoupling structure has been made. However, the laser bar can have several thermal decoupling structures, for example between every pair or between every second pair of adjacent individual emitters. Also, each decoupling structure may have two or more cooling elements, each completely covering a cooling region associated with that cooling element. Each decoupling structure may also have a trench. All information given here and in the following regarding one decoupling structure or one cooling element or one cooling region or one trench can therefore apply accordingly to all decoupling structures and all cooling elements and all cooling regions and all trenches of the laser bar.

In one embodiment, the edge-emitting laser bar comprises an AlInGaN-based semiconductor layer sequence with a contact side and an active layer for generating laser radiation. In addition, the laser bar comprises several individual emitters arranged next to each other and spaced apart from one another in a lateral transverse direction, each emitting laser radiation during intended operation. Several contact elements are arranged next to each other and spaced apart from one another in the lateral transverse direction on the contact side. The contact elements are configured for electrical contacting of the individual emitters, wherein each contact element is assigned to an individual emitter. Each contact element is electrically conductively coupled to the semiconductor layer sequence via a contiguous contact region of the contact side so that a current flow between the semiconductor layer sequence and the contact element is made possible via the contact region. In the region between two adjacent individual emitters, the laser bar comprises a thermal decoupling structure that counteracts heat exchange between the two adjacent individual emitters. The decoupling structure comprises a cooling element applied to the contact side that completely covers a contiguous cooling region of the contact side. The cooling element is electrically isolated from the semiconductor layer sequence along the cooling region and thermally coupled to the semiconductor layer sequence along the cooling region. The cooling region has a width, measured along the lateral transverse direction, which is at least half the width of an adjacent contact region.

In another embodiment, the edge-emitting laser bar comprises an AlInGaN-based semiconductor layer sequence having a contact side and an active layer for generating laser radiation. In addition, the laser bar comprises a plurality of individual emitters arranged next to each other and spaced apart from one another in a lateral transverse direction, each emitting laser radiation during intended operation. Several contact elements are arranged next to each other and spaced apart from one another in the lateral transverse direction on the contact side. The contact elements are configured for electrical contacting of the individual emitters, wherein each contact element is assigned to an individual emitter. Each contact element is electrically conductively coupled to the semiconductor layer sequence via a contiguous contact region on the contact side so that a current flow between the semiconductor layer sequence and the contact element is made possible via the contact region. In the region between two adjacent individual emitters, the laser bar comprises a thermal decoupling structure that counteracts heat exchange between the two adjacent individual emitters. The decoupling structure comprises a trench extending at least partially through the laser bar in a vertical direction perpendicular to the active layer.

Embodiments of the invention are based, among other things, on the following recognition:

Several individual laser diodes can be used for a high optical output power of AlInGaN-based lasers. One disadvantage is the high processing effort involved in separating, testing and finally mounting the individual laser diodes. In addition, if several laser diodes are soldered onto a common submount, high thermal stress can occur on the adjacent laser diodes during soldering of the individual laser diodes. Another disadvantage of using several individual laser diodes is the unavoidable adjustment tolerances when mounting the individual laser diodes. This causes the distances between adjacent laser diodes to fluctuate, which requires high adjustment effort when using focusing optics and leads to imaging losses.

In contrast, the GaAs-based material system, whose state of development is much more mature, has technologically advantageous laser bars with a number of individual emitters or individual laser diodes to increase the light output. In a laser bar, several equidistant index-guided (e.g. ridge laser) or gain-guided (e.g. oxide strip laser) individual emitters are simultaneously and parallel energized and thus contribute to an increased overall performance. Due to the insufficient yield, among other things, this solution cannot currently be transferred to the AlInGaN material system.

Even more important is the following fact, which is not due to the maturity of the technology, but is a direct consequence of the material system: Worldwide, despite years of effort, one has not succeeded in finding a flat acceptor for the AlInGaN material system. Therefore, only about 1% of the acceptors are activated at room temperature. Through higher temperatures, a significant reduction in the flux voltage of AlInGanN-based laser diodes can be achieved by means of amplified activation.

As a result, the individual emitters of an AlInGaN-based laser bar behave completely differently from the individual emitters of a GaAs-based laser bar. In GaAs-based laser bars, a defective or low light emitting individual emitter leads to a heating, which in adjacent individual emitters leads to increased threshold currents and reduced slopes, while the voltage is only slightly changed. As a result, the neighboring individual emitters also lose efficiency, which continues accordingly via the laser bars. Overall, the total power of the GaAs-based laser bar decreases accordingly.

With AlInGaN-based laser bars, a defective or low light emitting individual emitter leads to a heating, which primarily leads to a reduction of the operating voltage at adjacent individual emitters. This in turn leads to these adjacent individual emitters being supplied with an increased current intensity in the parallel connection of the laser bar and thus emitting an increased light output. Since the laser bar is usually operated close to the power limit of the individual emitters, the current increase described above can lead to a failure of an adjacent individual emitter due to facet damage (catastrophic optical damage, COD for short). As a result, as described above, due to heating of adjacent individual emitters, the damage can spread over the entire laser bar.

Based on this knowledge, the inventors have found a new solution for AlInGaN-based laser bars that can prevent the laser bar from burning. In particular, the solution provides for the arrangement of a thermal decoupling structure between two individual emitters, which counteracts a heat exchange between adjacent individual emitters.

According to at least one embodiment, the cooling element is formed by a contact element of an individual emitter adjacent to the decoupling structure. This means that one of the contact elements covers both the associated contact region and the adjacent cooling region. In the contact region the contact element is then electrically conductively connected to the semiconductor layer sequence, in the cooling region the contact element is electrically isolated from the semiconductor layer sequence.

According to at least one embodiment, in the cooling region, the cooling element is spaced from the contact side of the semiconductor layer sequence by a separating layer. For example, the separating layer can directly border to the cooling element and/or the semiconductor layer sequence. The separating layer can cover the entire cooling region.

The separating layer is preferably configured to provide electrical insulation between the cooling element and the semiconductor layer sequence for the intended operation. For this purpose, the separating layer may be made of an electrically insulating material. However, the separating layer can also be metallic, for example. In this case, the separating layer is selected in such a way that the contact resistance to the semiconductor layer sequence and/or the cooling element is so high that no current flows across the separating layer between the cooling element and the semiconductor layer sequence at voltages occurring during intended operation.

According to at least one embodiment, the separating layer has a thermal conductivity of at least 50 W/(m·K) or at least 75 W/(m·K) or at least 100 W/(m·K) or at least 150 W/(m·K) or at least 200 W/(m·K) or at least 500 W/(m·K). The thickness of the separating layer, measured from the contact element towards the contact side, is for example at least 5 nm or at least 10 nm or at least 50 nm or at least 100 nm. Alternatively or additionally, the thickness of the separating layer is not more than 1 μm or not more than 500 nm.

According to at least one embodiment, the separating layer comprises or consists of one of the following materials: SiC, DLC (Diamond-like Carbon), AlN, copper.

According to at least one embodiment, decoupling structures each having a cooling element are provided on both sides of an individual emitter. "On both sides" means in particular that, viewed along the lateral transverse direction, a decoupling structure is arranged on each side, i.e., on the left and right of the individual emitter. In particular, further individual emitters are arranged on both sides of the individual emitter. In each case, a decoupling structure is then provided between the individual emitter and the adjacent individual emitters.

According to at least one embodiment, the cooling elements of the two decoupling structures arranged on both sides of the individual emitter are formed by the contact element of the individual emitter. In other words, the contact element of the individual emitter extends beyond the contact region on both sides to adjacent cooling regions and covers these cooling regions.

According to at least one embodiment, the cooling element is a separate element from the contact elements and is spaced apart from the contact elements in the lateral transverse direction. In this case, the cooling element is not connected to the contact elements.

According to at least one embodiment, the cooling element is completely electrically isolated from the semiconductor layer sequence. In particular, no charge carriers from the semiconductor layer sequence can be injected into the cooling element during intended operation or vice versa.

According to at least one embodiment, the cooling element has the same material composition as the contact elements.

According to at least one embodiment, the cooling element has the same lateral dimensions as the individual contact elements within the manufacturing tolerance. Preferably, the thickness of the cooling element is equal to the thickness of the contact elements within the manufacturing tolerance. In particular, the cooling element and the contact elements can be applied to the semiconductor layer sequence in a common process step. When plan view on the contact side, the cooling element cannot be distinguished from the contact elements, for example.

According to at least one embodiment, the semiconductor layer sequence on the contact side has a number of parallel ribs, also known as ridges, spaced apart in the lateral transverse direction. The ribs are formed from the material of the semiconductor layer sequence. Each rib, for example, has a longitudinal extent along the lateral longitudinal direction that is at least twice or at least 5 times or at least 10 times as large as the width of the rib, measured along the lateral transverse direction. For example, the widths of the ribs are between 1 μm and 200 μm inclusive. The heights of the ribs, measured perpendicular to the lateral longitudinal direction and perpendicular to the lateral transverse direction, are, for example, between 100 nm and 2000 nm inclusive, preferably between 200 nm and 1000 nm inclusive.

According to at least one embodiment, each individual emitter comprises a rib. The contact region is formed in the region of the rib so that for operation of the individual emitter charge carriers are injected from the associated contact element into the active layer via the associated rib. Each individual emitter is assigned a rib, for example, uniquely. The contact elements of the individual emitters can partially cover and clasp the respective rib, for example to at least 80%. In particular, the individual emitters are designed as so-called index-guided laser diodes or ridge laser diodes.

According to at least one embodiment, the cooling element or cooling region is formed between two adjacent ribs. For example, in the cooling region, the contact side of the semiconductor layer sequence is flat within the manufacturing tolerance. In this case, for example, each rib is covered by a contact element.

According to at least one embodiment, the decoupling structure comprises a rib. In particular, no current flows into or out of the semiconductor layer sequence via the rib of the thermal decoupling structure during intended operation.

According to at least one embodiment, the cooling region of the decoupling structure extends over at least 80% or at least 90% of the rib associated with the decoupling structure. For example, the cooling element clasp the rib.

According to at least one embodiment, the decoupling structure comprises two electrically conductive cooling elements which are spaced apart from one another in the lateral transverse direction and which are not connected. This means that two cooling elements are arranged between two adjacent individual emitters. Each of these cooling elements can be a different element from the nearest contact element. Alternatively, each of these cooling elements can also be formed by a contact element of an individual emitter adjacent to the decoupling structure.

According to at least one embodiment, the individual emitters of the laser bar are gain-guided laser diodes.

According to at least one embodiment, all contact elements of the laser bar are arranged equidistantly to each other. This means that the distances between the contact elements, measured in the lateral transverse direction, are always the same within the manufacturing tolerance. However, the contact elements can also be arranged in pairs, wherein the pairs have a greater distance to each other than the two contact elements within each pair.

According to at least one embodiment, one or more cooling elements are arranged in the area between two individual emitters. For example, the cooling elements are different from the contact elements, i.e., they are not connected to the contact elements.

According to at least one embodiment, the distances between one contact element and the two closest cooling elements arranged on both sides of the contact element are the same. This means that the distance from each contact element to the closest cooling element on the left-hand side corresponds to the distance to the closest cooling element on the right-hand side within the manufacturing tolerance.

According to at least one embodiment, the distances between each contact element and the two closest cooling elements arranged on both sides of the contact element are different. For example, the larger one of the two distances is at least 1.5 times or at least twice or at least three times as large as the smaller one of the two distances.

According to at least one embodiment, the trench of the thermal decoupling structure extends at least partially through the semiconductor layer sequence. For example, the trench can extend from the contact side into the semiconductor layer sequence. The trench can then end before the active layer or penetrate the active layer. For example, the trench extends from the contact side through the p-conducting region of the semiconductor layer sequence and through the active layer into the n-conducting region of the semiconductor layer sequence. The trench can end in the n-conducting region of the semiconductor layer sequence. Alternatively, it is also possible for the trench to extend further through the n-conducting region of the semiconductor layer sequence into the growth substrate and end in the growth substrate. However, it is also possible that the trench extends from a side of the growth substrate opposite the contact side into the growth substrate and ends, for example, in the growth substrate.

In addition, an optoelectronic component is specified. The optoelectronic component comprises a laser bar as described herein. All features disclosed in connection with the laser bars are therefore also revealed for the optoelectronic component and vice versa.

According to at least one embodiment, the optoelectronic component comprises a heat sink. The laser bar is mounted on the heat sink and preferably electrically connected via the heat sink. For example, the heat sink forms a component that stabilizes the laser bar. The heat sink can be self-supporting. In particular, the heat sink may comprise or consist of SiC, BN, AlN, CuW, diamond.

According to at least one embodiment of the optoelectronic component, the contact elements and the cooling elements are each connected to the heat sink via a solder material or adhesive. This means that the laser bar is soldered onto the heat sink. A soldered connection or adhesive connection to the heat sink is made both via the contact elements and via the cooling elements. During intended operation, heat can be dissipated to the heat sink both via the contact elements and via the cooling elements.

BRIEF DESCRIPTION OF THE DRAWINGS

In the following, a laser bar described herein as well as an optoelectronic component described herein are explained in more detail with reference to drawings on the basis of exemplary embodiments. Same reference signs indicate same elements in the individual figures. However, the size ratios involved are not to scale, individual elements may rather be illustrated with an exaggerated size for a better understanding.

In the Figures.

DETAILED DESCRIPTION OF ILLUSTRATIVE EMBODIMENTS

Figure 1A:
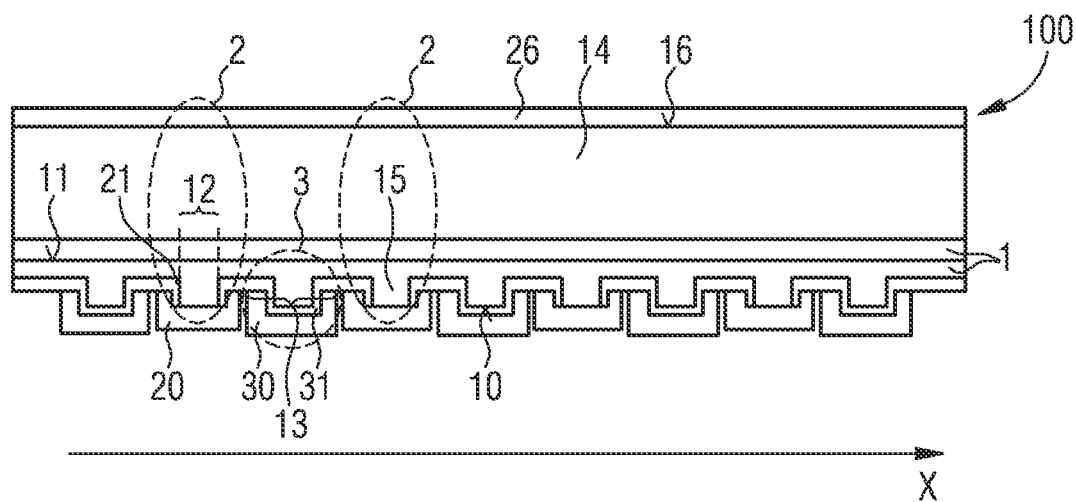
FIGS. 1A and 1B show an exemplary embodiment of a laser bar 100 in cross-sectional view and in plan view.

FIG. 1A shows an exemplary embodiment of the laser bar 100 in cross-sectional view. The laser bar 100 comprises a semiconductor layer sequence 1 that has grown on a growth substrate 14. The semiconductor layer sequence 1 is based on AlInGaN. The growth substrate 14, for example, is a GaN substrate. The semiconductor layer sequence 1 comprises an active layer 11, which for example has a pn junction or a quantum well structure, and in which laser radiation is generated by recombination of charge carriers during intended operation.

The semiconductor layer sequence 1 comprises a contact side 10 formed by the semiconductor layer sequence 1. A side of the growth substrate 14 opposite the contact side 10 forms a counter contact side 16. Contact elements 20 are applied to the contact side 10. The contact elements 20 are arranged next to each other and spaced apart in the lateral transverse direction X, which runs parallel to the main extension plane of the active layer 11.

Each contact element 20 is electrically coupled to the semiconductor layer sequence 1 in a contact region 12, so that a current flow between the semiconductor layer sequence 1 and the contact element 20 is made possible via the contact region 12. A counter contact element 26 is arranged on the counter contact side 16.

By injecting charge carriers via the contact elements 20 and the counter contact element 26, charge carriers are injected into the semiconductor layer sequence 1, in particular into the active layer 11, during intended operation of the laser bar 100, where they then recombine. Depending on via which of the contact elements 20 charge carriers are injected, a region of the active layer 11 above the contact element 20 generates laser radiation. In this way, several individual emitters 2 or laser diodes 2 (see dotted ellipses) are defined. These individual emitters 2 are spaced apart from each other in the lateral transverse direction X and arranged next to each other and generate and emit laser radiation during operation. The width of each individual emitter 2, measured along the lateral transverse direction X, is determined, for example, by the width of the region of the active layer 11 that generates laser radiation during operation of the individual emitter 2.

In the exemplary embodiment of FIG. 1A, each individual emitter 2 is designed as an index-guided laser diode. For this purpose, each individual emitter 2 comprises a rib 15 at the contact side 10, which is formed from the semiconductor layer sequence 1. The contact region 12 is in each case formed on the side of the rib 15 facing away from the active layer 11. The side walls of the ribs 15, which extend perpendicularly to the active layer 11, are covered with an electrically insulating layer 21. The contact elements 20 clasp the ribs 15 and are electrically conductively connected to the semiconductor layer sequence 1 in the area of the contact regions 12. In the area of the side walls of the ribs 15, the contact elements 20 are electrically isolated from the semiconductor layer sequence 1 by the electrically insulating layer 21. For example, the electrically insulating layer 21 comprises or consists of $SiO_2$, $Si_3N_4$, $Al_2O_3$, $Ta_2O_5$, $TiO_2$, $ZrO_2$.

A decoupling structure 3 (dotted line) is provided in the region between two adjacent individual emitters 2, which counteracts a heat exchange between the two adjacent individual emitters 2 during operation of the laser bar 100.

In the exemplary embodiment shown in FIG. 1A, the decoupling structure 3 comprises a cooling element 30 that completely covers a cooling region 13 of the contact side 10. Along the cooling region 13, the cooling element 30 is electrically isolated from the semiconductor layer sequence 1 and thermally coupled to the semiconductor layer sequence 1. For this purpose, the cooling element 30 is separated and electrically insulated from the cooling region 13 by a separating layer 31. In the exemplary embodiment of FIG. 1A, the separating layer 31 is formed by the electrically insulating layer 21, which is drawn over the cooling region 13.

The width of the cooling region 13, measured along the lateral transverse direction X, is greater than the width of the contact region 12, also measured along the lateral transverse direction X.

In FIG. 1A, the decoupling structure 3 also includes a rib 15 on which the cooling element 30 is mounted and which clasps the cooling element 30.

FIG. 1A further shows that each contact element 20 is at the same distance from the cooling element 30 arranged on the left side in the lateral transverse direction X and from the cooling element 30 arranged on the right side in the lateral transverse direction X. The contact elements 20 and the cooling elements 30 are arranged equidistantly to each other.

The laser bar 100 of FIG. 1A can be soldered onto a heat sink. Both the contact elements 20 and the cooling element 30 can be soldered or glued to the heat sink using a soldering material or adhesive. During operation of the laser bar 100, the heat in the region between the two adjacent individual emitters 2 can then be efficiently dissipated from the semiconductor layer sequence 1 via the cooling element 30 to the heat sink.

Figure 1B:
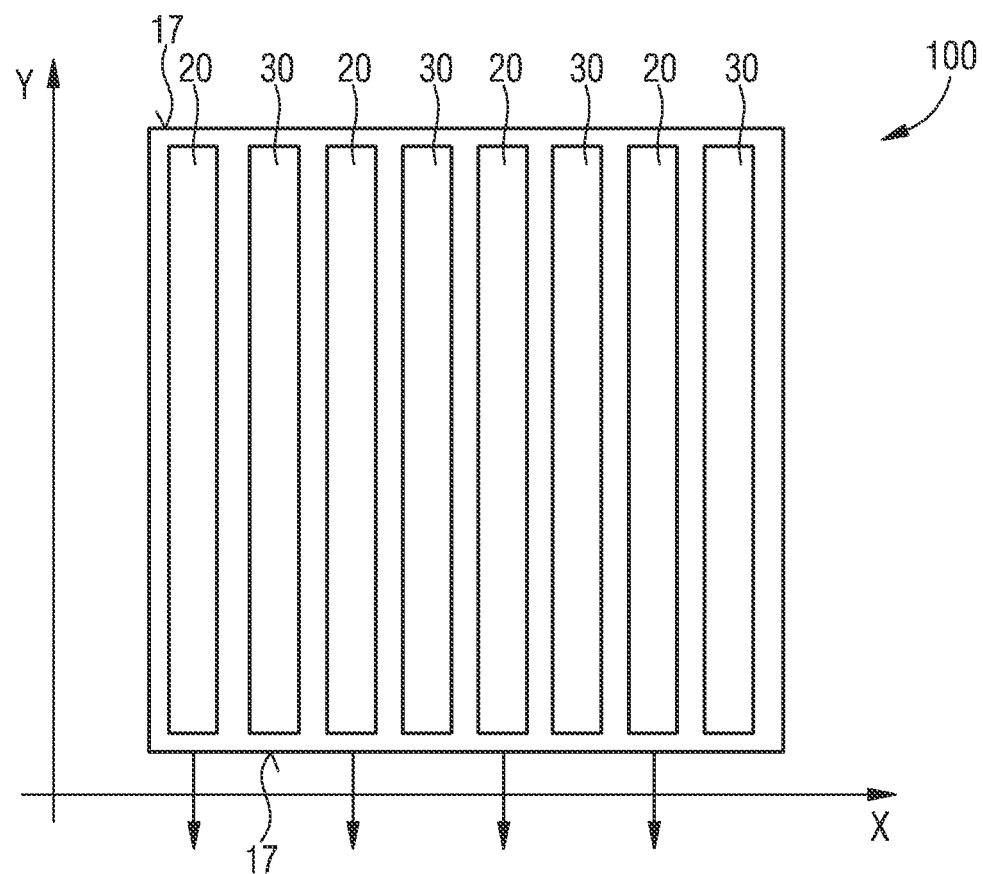

FIG. 1B shows the laser bar 100 of FIG. 1A in plan view on contact side 10. It can be seen that both the contact elements 20 and the cooling elements 30 are elongated or strip-shaped. The length of the contact elements 20 and the cooling elements 30 along their longitudinal axes is in each case several times greater than their widths. The contact elements 20 and the cooling element 30 are arranged at a distance from each other in the lateral transverse direction X, whereby the longitudinal axes of the cooling elements 20 and the contact elements 20 each run parallel to each other. Furthermore, the contact elements 20 and the cooling elements 30 extend with their longitudinal axis along the lateral longitudinal direction Y of the laser bar 100. In the lateral longitudinal direction Y, the laser radiation generated by each individual emitter 2 is also decoupled from the laser bar 100 (see arrows in FIG. 1B). For this purpose, the sides of the laser bar 100 opposite each other in the lateral longitudinal direction Y form facets 17.

Figure 2:
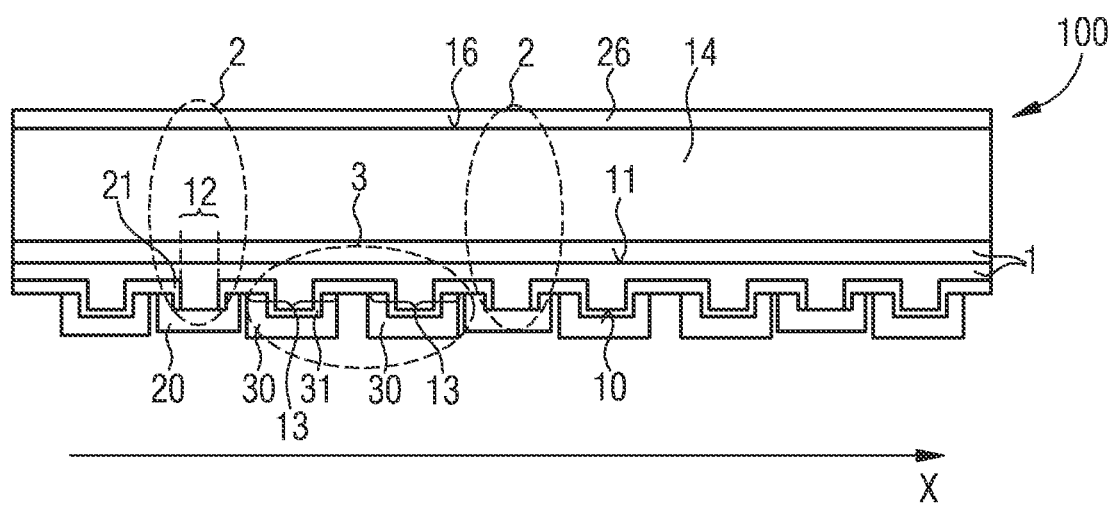
FIGS. 2 to 18 show exemplary embodiments of a laser bar in cross-sectional view.

FIG. 2 shows an exemplary embodiment of the laser bar 100 in cross-sectional view, in which, unlike FIG. 1A, the decoupling structure 3 arranged between two adjacent individual emitters 2 has not only one but two cooling elements 30, each of which completely covers a cooling region 13 of the contact side 10. This further strengthens the thermal decoupling effect of the decoupling structure 3.

Figure 3:
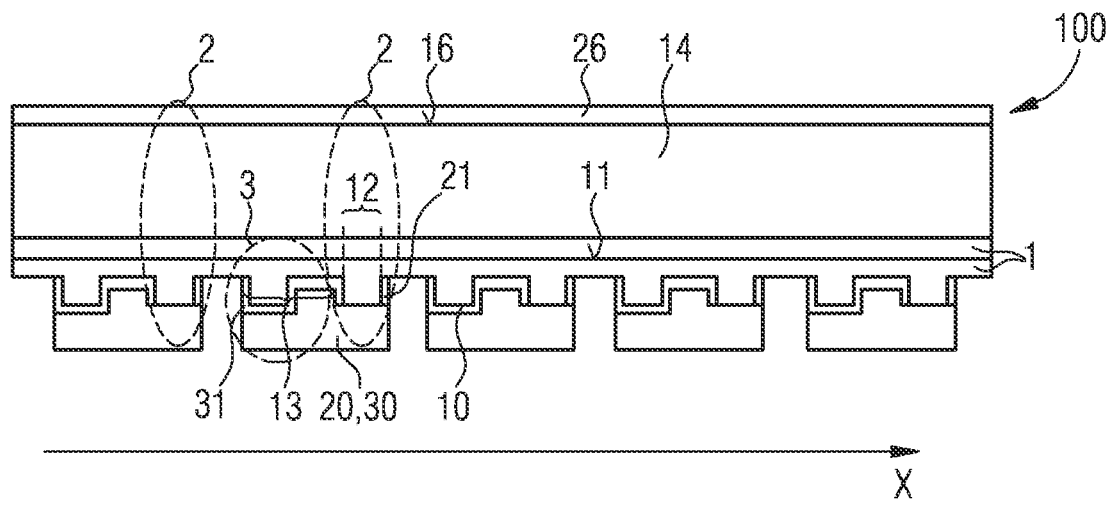

FIG. 3 shows an exemplary embodiment of the laser bar 100 in cross-sectional view, which is designed similarly to the laser bar 100 in FIG. 1A. In contrast to FIG. 1A, the cooling elements 30 are not separate elements being different from the contact elements 20. Rather, each contact element 20 also simultaneously forms a cooling element 30. The contact region 12 and an adjacent cooling region 13 are thus covered by a common, contiguous contact element 20 formed in one-piece, which also forms the cooling element 30. Such a design also has a positive effect on the heat dissipation properties of the decoupling structure 3.

Figure 4:
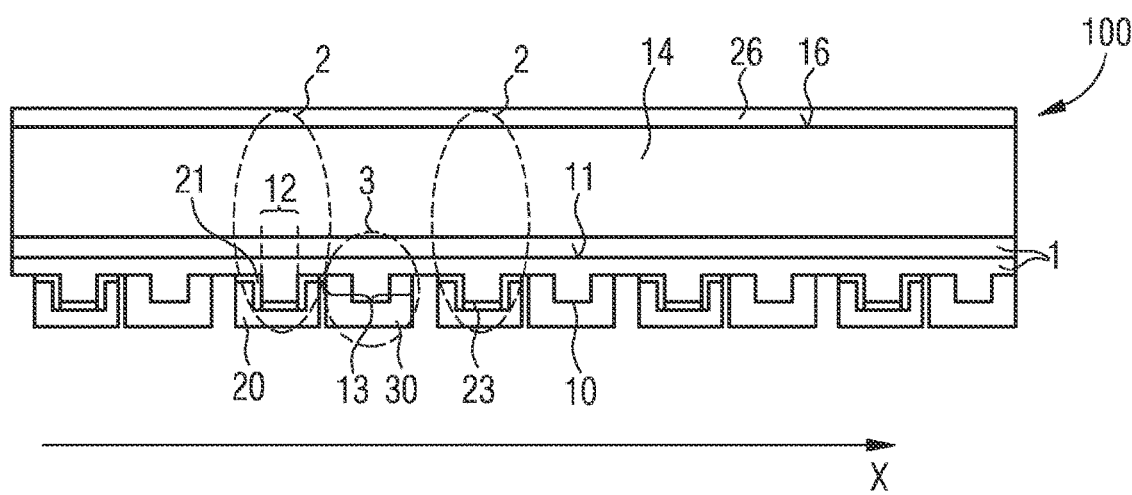

In contrast to the exemplary embodiment of FIG. 1A, the cooling elements 30 arranged on the left and right hand side of the contact elements 20 are not the same distance away from the contact element 20 in the exemplary embodiment of the laser bar 100 of FIG. 4. The cooling element 30 arranged on the right side of a contact element 20 is closer to the contact element 20 than the cooling element 30 arranged on the left side of the contact element 20. This asymmetrical arrangement allows a reduction in distortion to be achieved during the manufacturing process of the laser bar 100. Furthermore, the facet quality can be improved in this way.

In addition, the laser bar 100 of FIG. 4 has in each case a contact layer 23 in the area of the contact region 12, which ensures electrical contact between the contact element 20 and the semiconductor layer sequence. The contact layer 23 is part of the semiconductor layer sequence 1. This contact layer 23 is not present in the region of the decoupling structures 3. There, for example, the contact layer 23 was etched away during the manufacturing process. The cooling element 30 is electrically isolated from the cooling region 13 due to the missing contact layer 23. The contact layer 23, for example, is made of GaN or InGaN and is highly doped, for example. Since no insulating layer is used between the cooling elements 30 and the contact regions 13 for electrical insulation, heat dissipation via the cooling element 30 is further improved.

Figure 5:
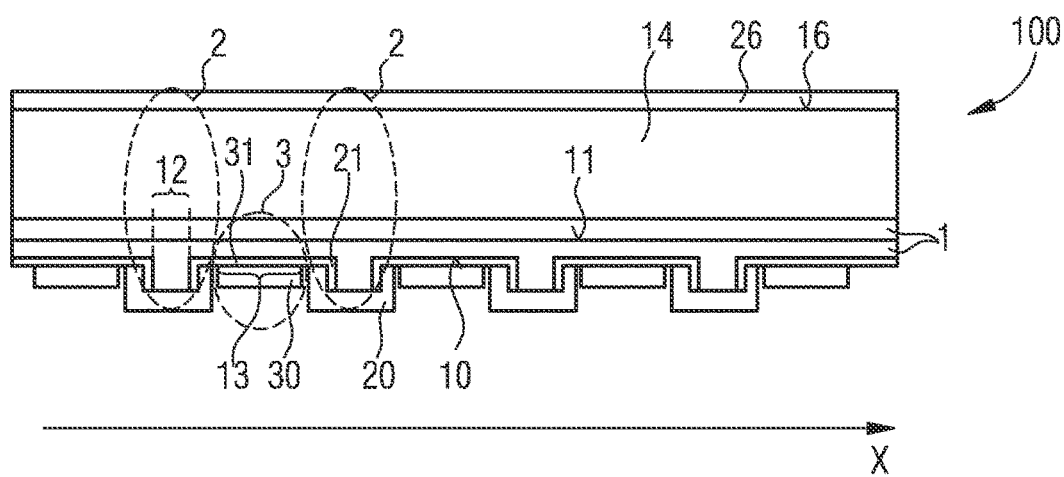

In contrast to the previous exemplary embodiments, the exemplary embodiment of the laser bar 100 of FIG. 5 does not include a rib 15 in the in the region of the decoupling structures 3. Rather, only the individual emitters have 2 ribs 15. In the region between two adjacent ribs 15, a cooling element 30 is applied to the contact side 10 of the semiconductor layer sequence 1. Due to the missing ribs 15 in the region of the decoupling structure 3, the risk of unwanted leakage currents in the region of the decoupling structure 3 is reduced.

Figure 6:
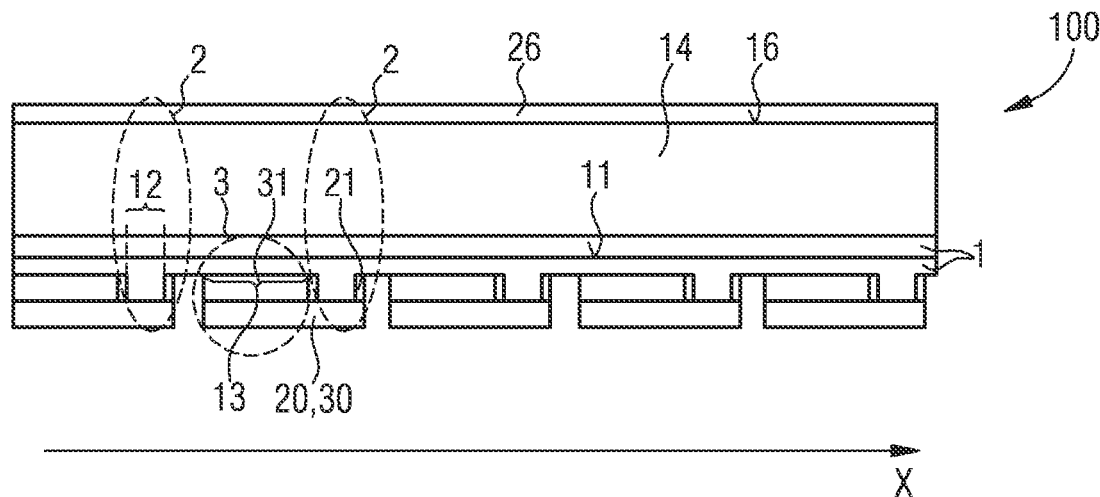

The exemplary embodiment of the laser bar 100 of FIG. 6 is similar to the exemplary embodiment of FIG. 5. Unlike FIG. 5, in FIG. 6 the cooling element 30 of each decoupling structure 3 is formed by the contact element 20 of an adjacent individual emitter 2. Thus, in each case, a cooling element 30 is connected to and formed in one piece with a contact element 20. Furthermore, unlike in the previous exemplary embodiments, the separating layer 31 between the cooling element 30 and the cooling region 13 is not formed by the insulating layer 21, but by a highly thermally conductive material with a thermal conductivity of at least 50 W/(m·K). The separating layer 31, for example, consists of SiC or AlN or DLC. Such a highly thermally conductive separating layer 31 can further increase the thermal decoupling of two adjacent individual emitters 2.

Figure 7:
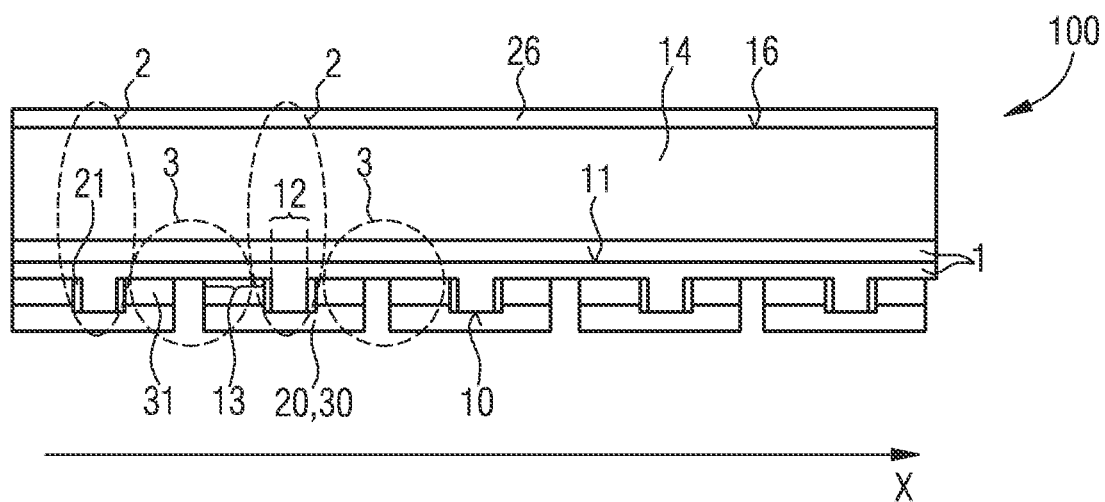

In contrast to the exemplary embodiment of FIG. 6, in the exemplary embodiment of the laser bar 100 of FIG. 7, each contact element 20 of the individual emitters 2 forms not only the cooling element 30 of one adjacent decoupling structure 3, but the cooling elements 30 of two decoupling structures 3, which are arranged on both sides, i.e., on the left and right of the individual emitter 2 when viewed in the lateral transverse direction. This results in efficient heat dissipation via the contact elements 20/cooling elements 30.

Figure 8:
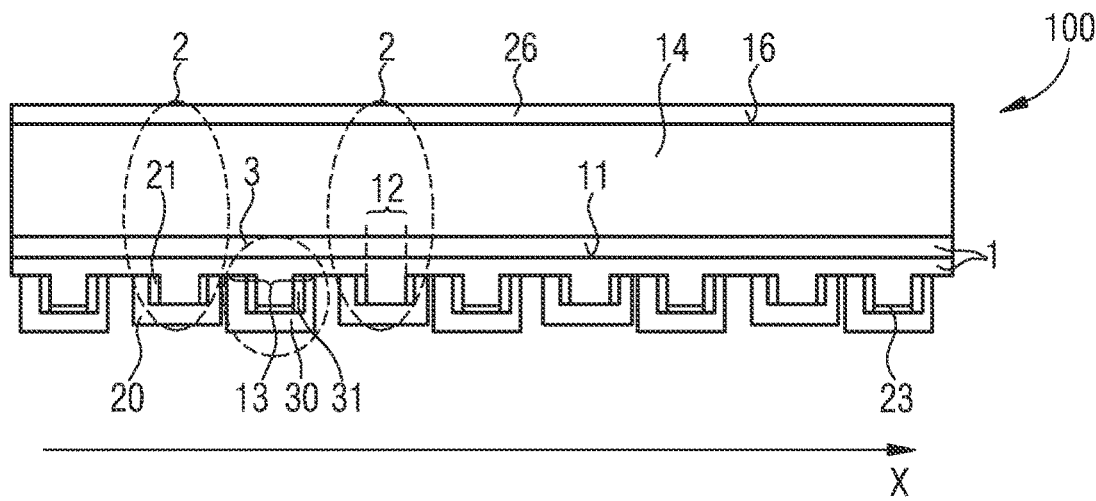

The exemplary embodiment of the laser bar 100 of FIG. 8 essentially corresponds to the exemplary embodiment of FIG. 1A. However, in the exemplary embodiment of FIG. 8, the cooling elements 30 adjacent to a contact element 20 on both sides are at different distances from this contact element 20. The resulting advantages are, as mentioned above, a reduction of the stresses during the manufacturing process and an improved facet quality.

Figure 9:
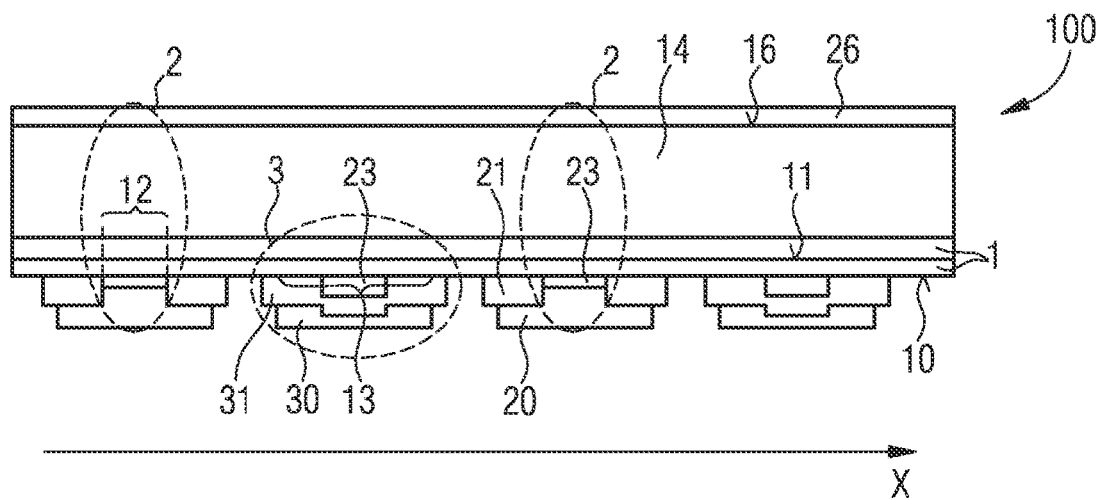

FIG. 9 shows an exemplary embodiment of the laser bar 100, which differs from the laser bars 100 of FIGS. 1 to 8 in particular in that the various individual emitters 2 are no longer index-guided laser diodes but gain-guided laser diodes. In particular, the semiconductor layer sequence 1 at contact side 10 is flat over its entire lateral extent within the manufacturing tolerance and has no ribs. In the region of the contact regions 12, a contact layer 23 is in each case provided for electrical contacting between a contact element 20 and the semiconductor layer sequence 1, similar to the exemplary embodiment of FIG. 4. Such a contact layer 23 is also provided in each of the cooling regions 13. There, however, the contact layer 23 is electrically isolated from the cooling element 30 by the separating layer 31.

Figure 10:
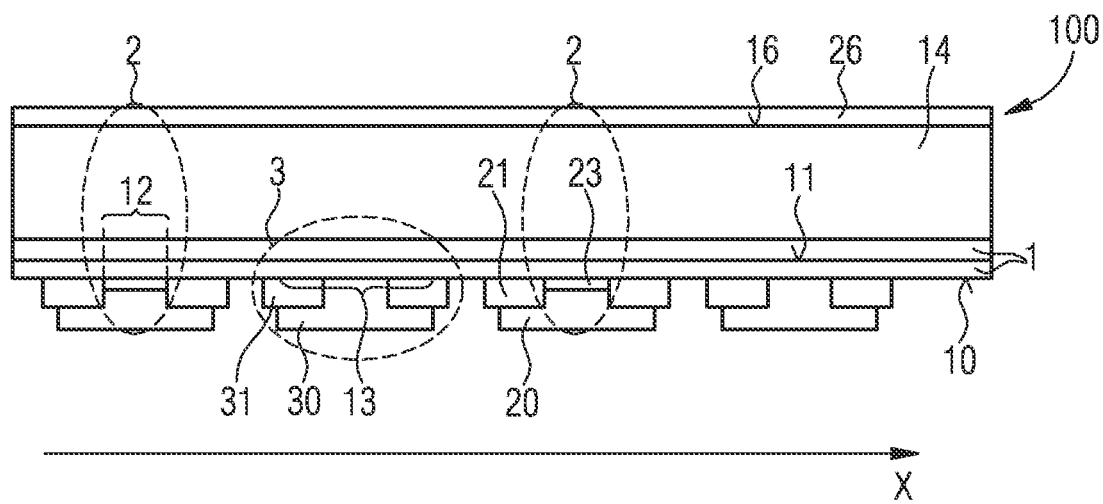

The exemplary embodiment of the laser bar 100 of FIG. 10 differs from the exemplary embodiment of FIG. 9 in that no separating layer 31 is provided between the cooling elements 30 and the associated cooling regions 13. Instead, the contact layer 23 of the decoupling structures 3 is etched off, so that the cooling elements 30 are electrically isolated from the semiconductor layer sequence 1.

Figure 11:
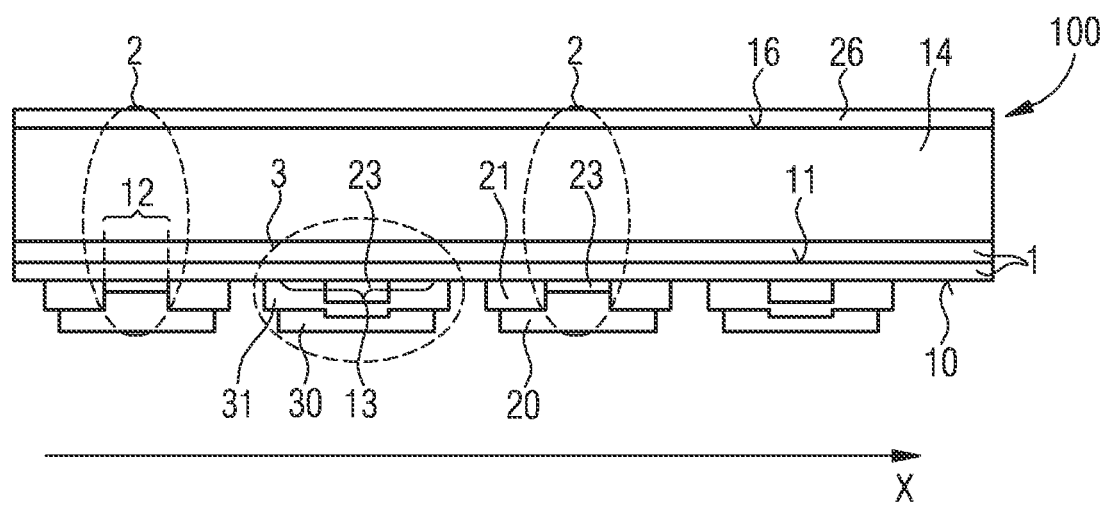

The exemplary embodiment of the laser bar 100 of FIG. 11 essentially corresponds to the exemplary embodiment of FIG. 9. However, as an electrically insulating layer 21 between the contact elements 20 and the semiconductor layer sequence 1 and as a separating layer 31 between the cooling elements 30 and the contact regions 13, a highly thermally conductive material, such as one of the above-mentioned materials, is used in the exemplary embodiment of FIG. 11. This increases heat dissipation via the contact elements 20 and cooling elements 30.

Figure 12:
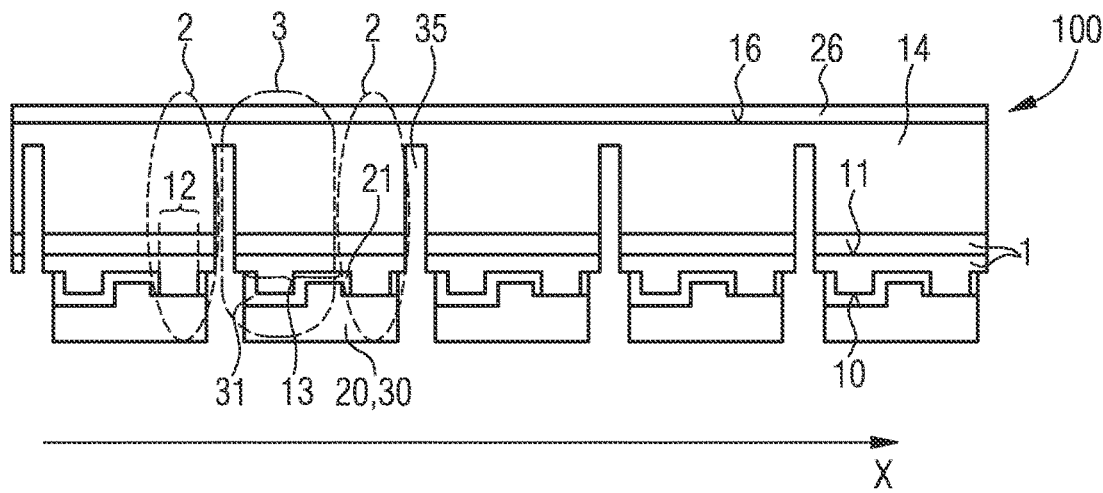

FIG. 12 shows an exemplary embodiment of the laser bar 100, which essentially corresponds to the exemplary embodiment of FIG. 3. In addition, the thermal decoupling structures 3 in FIG. 12 each have a trench 35 which, starting from the contact side 10, extends completely through the semiconductor layer sequence 1, i.e., also through the active layer 11, into the growth substrate 14. The trenches 35 penetrate the growth substrate 14 by more than 50%. The trenches 35 reduce the heat exchange between adjacent individual emitters 2.

Figure 13:
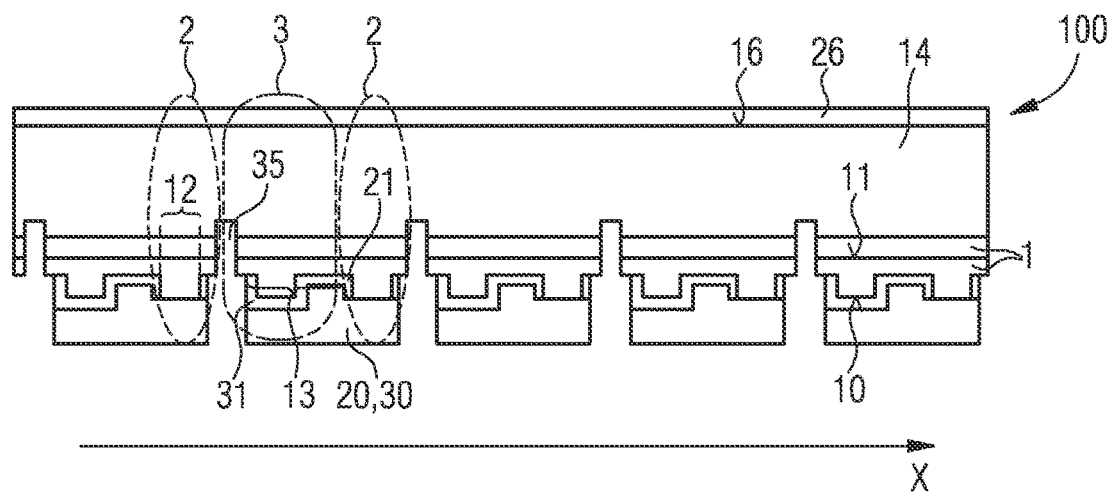

In the exemplary embodiment of the laser bar 100 of FIG. 13, the trenches 35 are less deep than in the exemplary embodiment of FIG. 12. In particular, the trenches 35 penetrate the growth substrate 14 by less than 50%. Although this slightly reduces thermal decoupling compared to the exemplary embodiment of FIG. 12, the facet fracture quality is less impaired in the manufacturing process.

Figure 14:
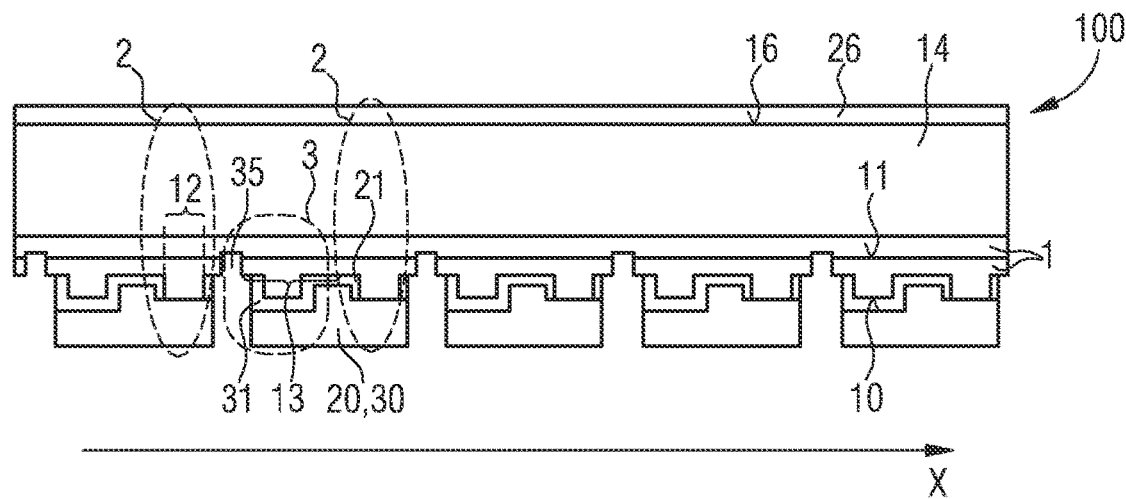

In the exemplary embodiment of the laser bar 100 of FIG. 14, the trenches 35 no longer completely penetrate the semiconductor layer sequence starting from the contact side 10, but end in the n-conducting region of the semiconductor layer sequence 1 arranged between the active layer 11 and the growth substrate 14.

Figure 15:
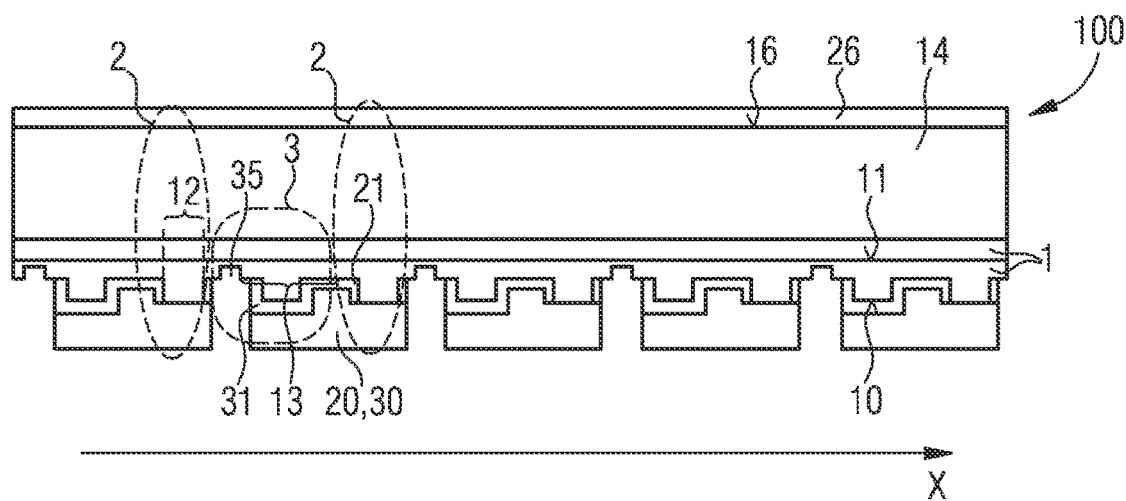

In the exemplary embodiment of the laser bar 100 of FIG. 15, the trenches 35 are even less deep than in FIG. 14 and, starting from the contact side 10, partially penetrate the p-conducting region of the semiconductor layer sequence 1 and end in front of the active layer 1. The active layer 11 is therefore not penetrated by the trenches 35 and is simply-connected.

Figure 16:
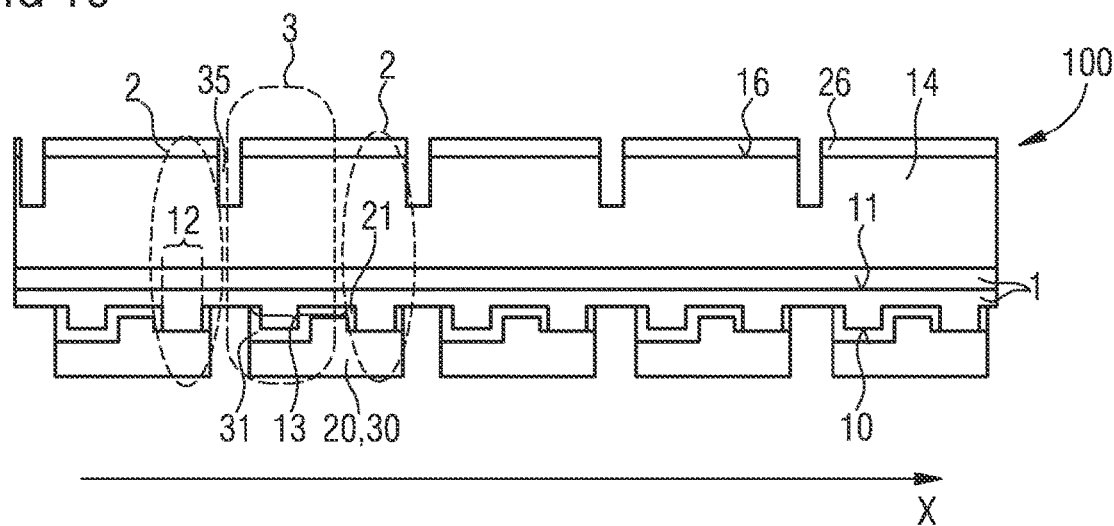

In the exemplary embodiment of the laser bar 100 of FIG. 16, the trenches 35 do not extend from the contact side 10 into the semiconductor layer sequence 1, but from the side of the growth substrate 14 opposite the contact side 10 into the growth substrate 14. As a result, the influence of the trenches 35 on the facet fracture quality during the manufacturing process can be further reduced.

Figure 17:
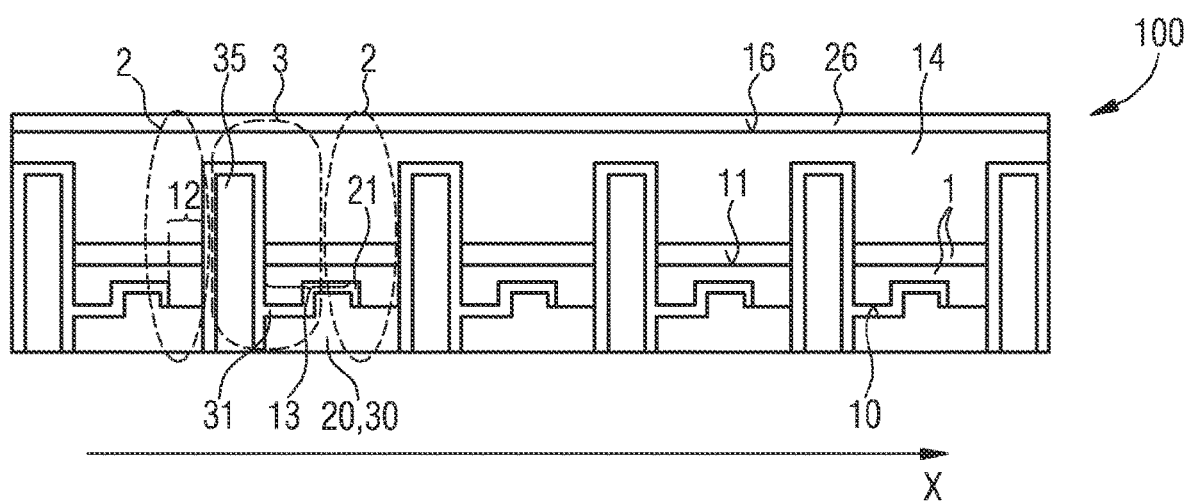

FIG. 17 shows an exemplary embodiment of the laser bar 100, which essentially corresponds to the exemplary embodiment of FIG. 12. In FIG. 17, however, the trenches 35 are additionally filled with a thermally conductive material. The thermally conductive material can be AlN, SiC, DLC or a metal such as Au, Pt, Pd, Rh, Ti, Cr, Sn, Ni, Al, Cu, Ag, In, Zn, W, Ta or a combination of these materials.

In FIG. 17, the thermally conductive material filled in the trenches 35 is electrically insulated from the material of the cooling elements 30/contact elements 20 by an insulating layer 21.

Figure 18:
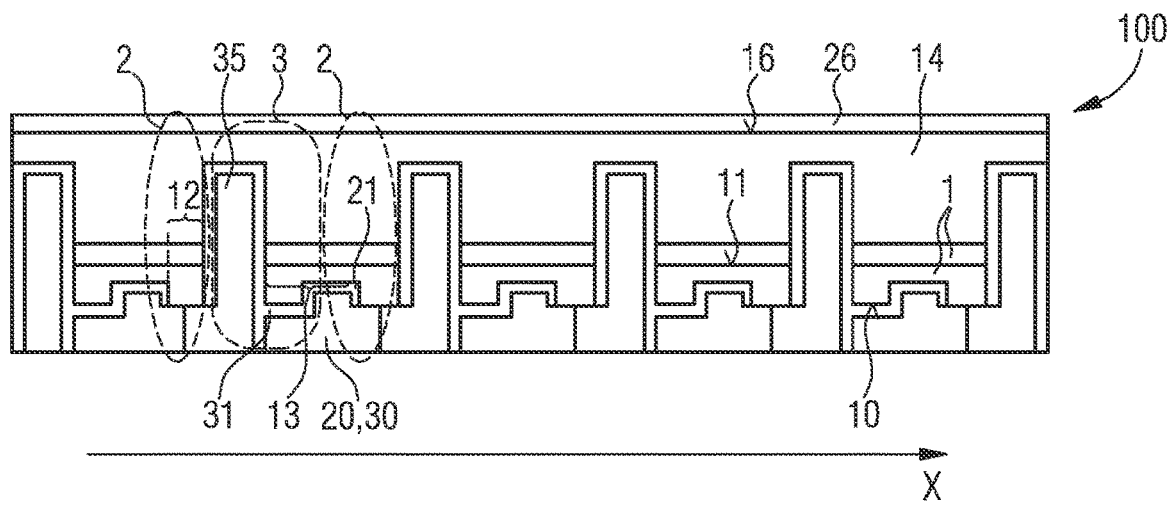

In the exemplary embodiment of the laser bar 100 of FIG. 18, this insulation between the thermally conductive material in the trenches 35 and the cooling elements 30/contact elements 20 is omitted. Particularly, the thermally conductive material in the trenches 35 is therefore electrically connected to the cooling elements 30/contact elements 20. This means that the heat transported via the thermally conductive material of the trenches 35 in the direction of contact side 10 can also be distributed over a large area at contact side 10 to the contact elements 20/cooling elements 30, which further increases the cooling efficiency.

In the exemplary embodiments of FIGS. 12 to 18, the trenches 35 have a width, measured along the lateral transverse direction X, of between 10 μm and 200 μm, for example. The lengths of the trenches 35, measured along the lateral longitudinal direction Y, are preferably many times larger than the widths.

Furthermore, in the exemplary embodiments of FIGS. 12 to 18, decoupling structures 3 are always shown, which comprise both a cooling element 30 and a trench 35. However, it is also possible that the decoupling structures 3 only comprise the trenches 35 shown without the cooling elements 30.

Figure 19:
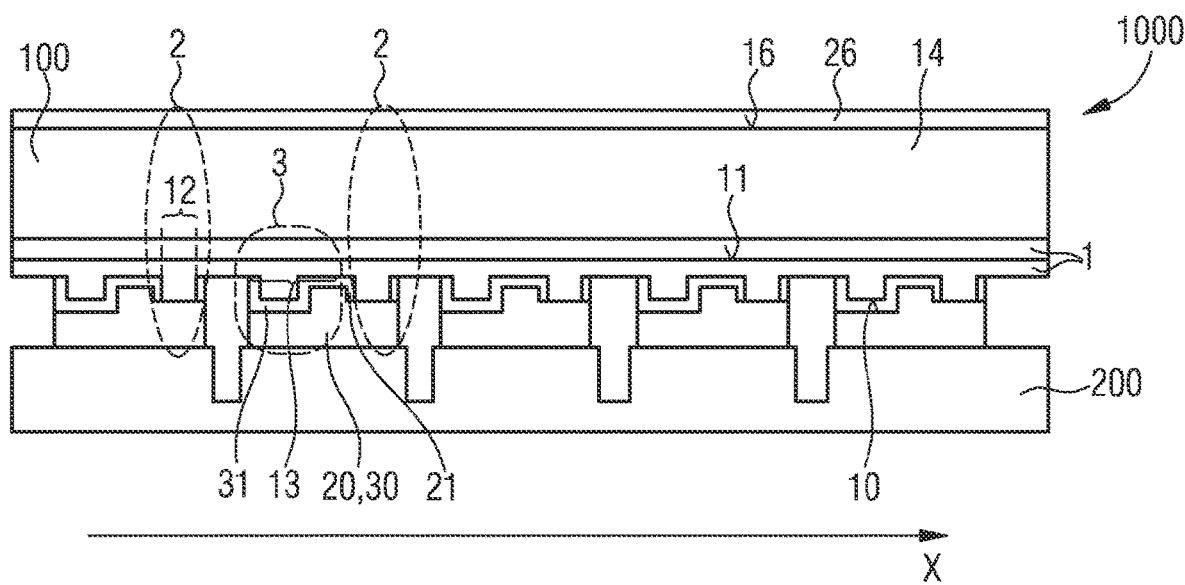
FIG. 19 shows an exemplary embodiment of an optoelectronic component in cross-sectional view.

FIG. 19 shows an exemplary embodiment of an optoelectronic component 1000. The optoelectronic component 1000 comprises a laser bar 100 as described in FIG. 3. The laser bar 100 is soldered onto a heat sink 200. The heat sink 200 also acts as an electrical connection carrier for contacting the contact elements 20. The heat sink 200 also comprises trenches that extend perpendicularly to the active layer. These trenches reduce the heat transport inside the heat sink 200 along the lateral transverse direction X.

The invention described herein is not limited by the description in conjunction with the exemplary embodiments. Rather, the invention comprises any new feature as well as any combination of features, particularly including any combination of features in the patent claims, even if said feature or said combination per se is not explicitly stated in the patent claims or exemplary embodiments.

What is claimed is:

1. An edge-emitting laser bar comprising:
   an AlInGaN-based semiconductor layer sequence having a contact side and an active layer configured to generate laser radiation;
   a plurality of individual emitters arranged next to each other and spaced apart from one another in a lateral transverse direction, each emitter configured to emit laser radiation; and
   a plurality of contact elements arranged next to each other and spaced apart from one another in the lateral transverse direction on the contact side for making electrical contact with the individual emitters, each contact element being assigned to an individual emitter,
   wherein each contact element is electrically conductively coupled to the semiconductor layer sequence via a contiguous contact region of the contact side so that a current flow between the semiconductor layer sequence and the contact element is possible via the contact region,
   wherein the laser bar has a thermal decoupling structure in a region between two adjacent individual emitters, the thermal decoupling structure being configured to counteract a heat exchange between the two adjacent individual emitters,
   wherein the decoupling structure comprises an electrically conductive cooling element located on the contact side and completely covering a contiguous cooling region of the contact side,
   wherein the cooling element is electrically isolated from the semiconductor layer sequence along the cooling region and thermally coupled to the semiconductor layer sequence along the cooling region,
   wherein the cooling region has a width, measured along the lateral transverse direction, which is at least half a width of an adjacent contact region,
   wherein all contact elements are arranged equidistantly to each other,
   wherein one or more cooling elements are arranged in the region between each two individual emitters and are in each case elements which are different from the contact elements,
   wherein the cooling elements in the cooling region are spaced from the contact side of the semiconductor layer sequence by a separating layer, and wherein the separating layer comprises one of the following materials: SiC, DLC or AlN.

2. The laser bar according to claim 1, wherein the contact elements are separated from one another and are not connected to each other.

3. The laser bar according to claim 1, wherein the cooling element comprises a contact element of an individual emitter adjacent to the decoupling structure.

4. The laser bar according to claim 3, wherein the decoupling structure having a cooling element is provided on both sides of an individual emitter, and wherein the cooling elements of the two decoupling structures arranged on both sides comprise the contact element of the individual emitter.

5. The laser bar according to claim 1, wherein the separating layer has a thermal conductivity of at least 50 W/(m·K).

6. The laser bar according to claim 1, wherein the cooling element is a separate element from the contact elements and spaced apart from the contact elements in the lateral transverse direction, and wherein the cooling element is completely electrically isolated from the semiconductor layer sequence.

7. The laser bar according to claim 6, wherein the cooling element has the same material composition as the contact elements, and wherein the cooling element has the same lateral dimensions as the individual contact elements within a manufacturing tolerance.

8. The laser bar according to claim 1, wherein the semiconductor layer sequence comprises a plurality of parallel ribs spaced apart in the lateral transverse direction at the contact side, wherein each individual emitter comprises a rib, and wherein the contact region is formed in a region of the rib, respectively, so that charge carriers are injected from an associated contact element into the active layer via an associated rib in order to operate the individual emitter.

9. The laser bar according to claim 1, wherein the decoupling structure comprises a rib, and wherein the cooling region of the decoupling structure extends over at least 80% of the rib associated with the decoupling structure.

10. The laser bar according to claim 1, wherein the decoupling structure comprises two electrically conductive cooling elements which are spaced apart from one another in the lateral transverse direction and which are not connected.

11. The laser bar according to claim 1, wherein the individual emitters are gain-guided laser diodes.

12. An optoelectronic component comprising:
    the laser bar according to claim 1; and
    a heat sink,
    wherein the contact elements and the cooling elements are each connected to the heat sink via a solder material or an adhesive.

* * * * *